United States Patent [19]
Mauritz et al.

[11] Patent Number: 5,276,834
[45] Date of Patent: Jan. 4, 1994

[54] SPARE MEMORY ARRANGEMENT

[75] Inventors: Karl H. Mauritz, Eagle; Thomas W. Voshell; James M. Shaffer, both of Boise, all of Id.

[73] Assignee: Micron Technology, Inc., Boise, Id.

[21] Appl. No.: 621,869

[22] Filed: Dec. 4, 1990

[51] Int. Cl.$^5$ .................. G06F 12/16; G06F 12/02
[52] U.S. Cl. .................................................. 395/425
[58] Field of Search 364MS/200MS; 900MS; 395/425; 365/200; 371/10

[56] References Cited

U.S. PATENT DOCUMENTS

| | | | |
|---|---|---|---|
| 3,633,175 | 1/1972 | Harper | 395/425 |
| 3,940,740 | 2/1976 | Coontz | 340/166 |
| 4,093,985 | 6/1978 | Das | 395/575 |
| 4,228,528 | 10/1980 | Cenker et al. | 365/200 |
| 4,450,559 | 5/1984 | Bond et al. | 371/10.1 |
| 4,459,685 | 7/1984 | Sud et al. | 365/200 |
| 4,463,450 | 7/1984 | Haeusele | 365/200 |
| 4,471,472 | 9/1984 | Young | 365/200 |
| 4,514,830 | 4/1985 | Hagiwara et al. | 365/200 |
| 4,556,975 | 12/1985 | Smith et al. | 365/200 |
| 4,571,707 | 2/1986 | Watanabe | 365/200 |
| 4,586,170 | 4/1986 | O'Toole et al. | 365/200 |
| 4,598,388 | 7/1986 | Anderson | 365/200 |
| 4,639,897 | 1/1987 | Wacyk | 365/200 |
| 4,656,610 | 4/1987 | Yoshida et al. | 365/200 |
| 4,672,240 | 6/1987 | Smith et al. | 307/449 |
| 4,688,219 | 8/1987 | Takemae | 365/200 |
| 4,701,887 | 10/1987 | Ogawa | 365/200 |
| 4,726,021 | 2/1988 | Horiguchi et al. | 371/38 |
| 4,733,372 | 3/1988 | Nanbu et al. | 365/200 |
| 4,733,394 | 3/1988 | Giebel | 371/21 |
| 4,748,597 | 5/1988 | Saito et al. | 365/230 |
| 4,752,914 | 6/1988 | Nakano et al. | 365/200 |
| 4,757,474 | 7/1988 | Fukushi et al. | 365/189 |
| 4,757,475 | 7/1988 | Awaya | 365/200 |
| 4,768,193 | 8/1988 | Takenae | 371/10 |
| 4,783,781 | 11/1988 | Awaya | 371/10 |
| 4,794,568 | 12/1988 | Lim et al. | 365/200 |
| 4,803,656 | 2/1988 | Takemae | 365/200 |
| 4,809,228 | 2/1989 | Iida | 365/189 |
| 4,811,298 | 3/1989 | Helwig et al. | 365/200 |
| 4,823,252 | 4/1989 | Horst et al. | 371/8 |
| 4,827,452 | 5/1989 | Toyama | 365/200 |
| 4,833,652 | 5/1989 | Isobe et al. | 365/201 |
| 4,847,810 | 7/1989 | Tagani | 365/200 |
| 4,858,192 | 8/1989 | Tatsumi et al. | 365/200 |
| 4,942,556 | 7/1990 | Sasaki et al. | 365/200 |
| 5,025,418 | 6/1991 | Asoh | 365/200 |
| 5,146,606 | 9/1992 | Grondalski | 395/800 |

*Primary Examiner*—Joseph L. Dixon
*Assistant Examiner*—Matthew M. Kim
*Attorney, Agent, or Firm*—Stephen A. Gratton

[57] ABSTRACT

A spare memory arrangement in which a defective chip in a memory array can be electronically replaced with a spare chip of identical construction. A defective memory chip is first detected and located by a suitable means, such as an error correction code (ECC), check sum, or parity check. A sparer chip is constructed to be actuated upon a read to the defective memory chip to replace the defective chip with a memory spare chip. The sparer chip includes a cross-point memory (CPM) cell having an address register for receiving data from a central processing unit (CPU) and routing the data to and from the spare memory chip. The cross-point memory (CPM) cell is actuated by control input from the (CPU).

13 Claims, 5 Drawing Sheets

# SPARE MEMORY ARRANGEMENT

FIELD OF THE INVENTION

This invention relates to semiconductor memories and, more particularly, to a spare memory arrangement that allows one or more outputs of a defective semiconductor memory chip to be electronically switched into a spare memory chip.

BACKGROUND OF THE INVENTION

As integrated circuit memories become larger and more complex, reliability of individual components becomes increasingly important. In general, no matter how reliable each component is the system reliability goes down inversely as the number of components increases. For memory systems, parity or error correction has historically dealt with this problem by considering that every device had an independent failure rate compared to every other device of the same nature.

In general, prior art error correction systems have been directed to independent failures on a board. In general, substitution of spare elements for defective elements incorporated in a memory involved the alteration of the circuit configuration on an individual chip. This was typically accomplished by the use of fusible links or destructive changes in individual cell characteristics by, for example, a laser beam directed at the chip. Other prior art error correction method involve redundant columns of cells which can be electronically substituted by suitable circuitry to columns containing defective cells.

In general, these prior art arrangements are effective for independent failures on a board. As memory technology advances, however, the dominant error mode will shift to multiple bit errors (dependent error mode). Today's DRAMs or memories have multiple outputs per chip (chip kill will affect from four to eight outputs per chip), giving each bit a dependent failure rate. In these situations, it would be desirable for a correction mechanism to map out and replace a failed memory chip in its entirety rather than just compensating for a single bit lane loss.

The present invention is directed to a mechanism for placing spare memory chips at any location in a memory array to replace defective memory chips. A memory of 256 MEGABYTES, for example will have about 2500 chips. By past experience, a time between failures of ¾ of a year for the total system can be assumed. If the offending memory chip is replaced by a spare memory chip, then the ¾ of a year failure rate can be stretched to the service life of the system.

SUMMARY OF THE INVENTION

In accordance with the present invention, a semiconduotor spare memory arrangement is provided. In particular, one or multiple outputs of a defective semiconductor chip can be electronically switched into a spare chip via a chip called a sparer chip. The sparer chip can be used in conjunction with an error correction (ECC) scheme or format, such as a parity or check sum. By logging the (ECC) correction location or parity error location and via periodic memory testing, a spare chip can be substituted for a defective chip.

The invention broadly stated comprises a memory control system including:

a memory array having a plurality of memory chips;

a detection system, such as an (ECC), for detecting a defective chip in the memory array;

a plurality of spare chips identical in construction to the chips of the memory array;

a sparer chip means for electronically enabling a spare memory chip to replace the defective memory chip and for establishing a map to and from the spare memory chip.

In an illustrative embodiment, the sparer chip includes a cross-point memory cell (CPM) located between bus data lines, memory data lines to the memory chips, and sparing data lines to the spare chips. The cross-point memory cell (CPM) includes an address register for locating and mapping data to a defective chip and to-and-from a spare chip.

In use of the memory system of the invention, the following sequence may occur:

1. data may be written to a memory array using an (ECC), check sum, parity, or the like, and the data may be read and verified;
2. a defective chip may be located in the memory array; and
3. the defective chip may be replaced with a spare chip by actuation of the sparer chip and an electronic route may be established for data through the cross-point memory (CPM) all to and from the spare chip. Thus, a spare memory chip can be placed at any location in a memory array to replace a defective memory chip.

Other objects, advantages, and capabilities of the present invention will become more apparent as the description proceeds.

DETAILED DESCRIPTION OF THE PREFERRED EMBODIMENT

Figure 1:
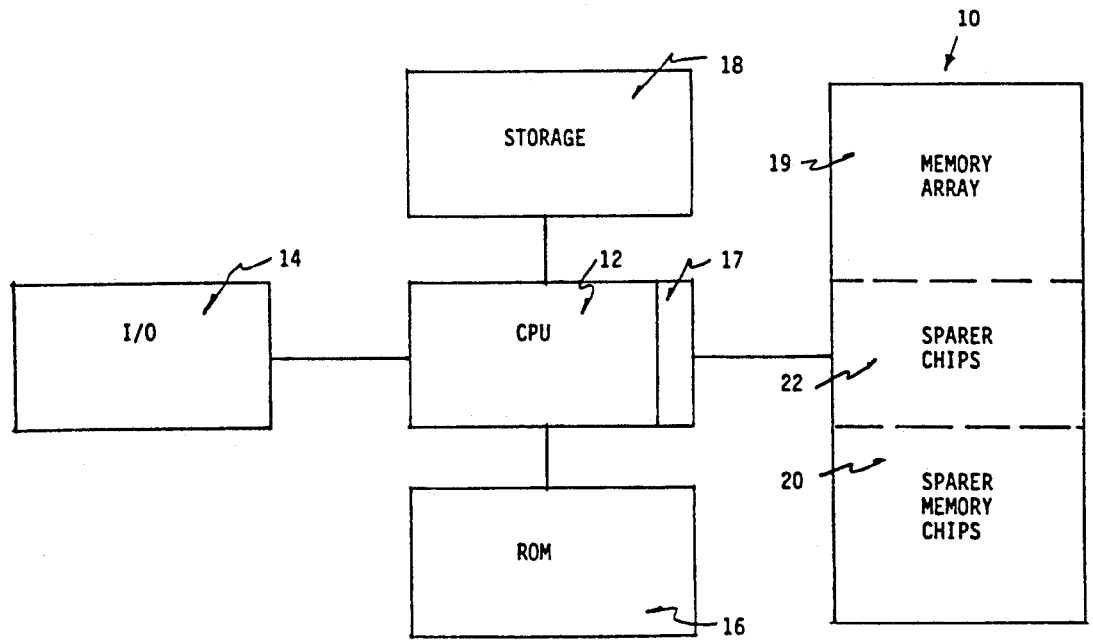
FIG. 1 is a schematic diagram showing components of a computer system with a spare memory arrangement constructed in accordance with the invention.

Referring now to FIG. 1, a memory system constructed in accordance with the invention is shown and generally designated as 10. The memory system 10 is coupled to a central processing unit (CPU) 12, which is the computer module which fetches, decodes, and executes instructions. The (CPU) 12 in turn is coupled to an I/O device 14 which communicates information to and from the (CPU) 12. The (CPU) 12 may also be coupled to a read-only memory (ROM) 16 and a memory storage device 18. Memory interface logic 17 physically connects the memory system 10 to the (CPU) 12 and detects errors through an error correction code (ECC) or other suitable means.

The memory system 10 is comprised of a memory array 19 including a plurality of semiconductor chips that retain data either electronically or magnetically. The memory chips 19 may be arranged in a matrix of rows and columns. Each memory chip 19, in turn, reads or writes data through an address register included within the chip.

A memory system 10 constructed in accordance with the invention also includes a plurality of spare memory chips 20 identical in construction to the memory chips 19 in the memory array and a plurality of sparer chips 22 for replacing a defective memory chip with a spare memory chip.

The memory system 10 of the invention is intended for use in conjunction with periodic memory testing in which some type of error correction (ECC) is utilized to detect a faulty memory chip 19 in the memory array. An illustrative operational sequence may be as follows:

a. (ECC) detects a defective chip in memory;
b. a cross-point memory (CPM) cell 23 and address register 28 within the sparer chip 22 representing the location of the defective chip is determined;
c. the cross-point memory (CPM) cell 23 of a spare chip 22 is actuated and during a read to the defective chip 24 disconnects the defective chip 24 and replaces it with a spare chip 20; and
d. on a write, the data are written to both the defective memory chip 24 and the spare memory chip 20.

Figure 2:
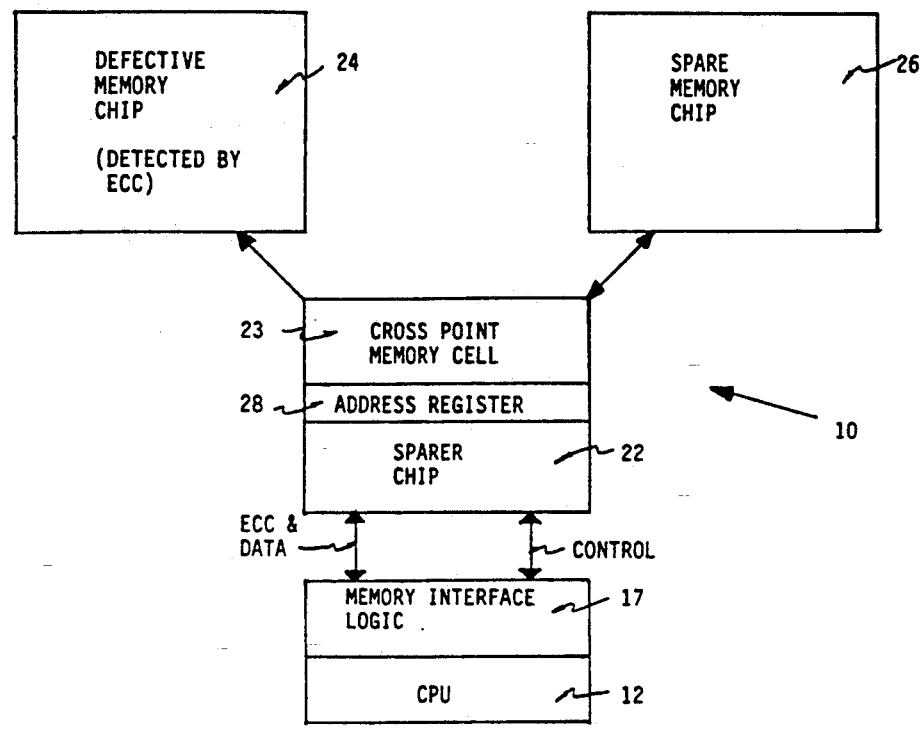
FIG. 2 is a block diagram showing operation of a spare memory system constructed in accordance with the invention.

This sequence of operations is shown in a block diagram in FIG. 2. The invention thus allows a replacement or spare memory chip 26 to be enabled upon detection of a defective memory chip 24 to replace the defective chip 24.

In use of the invention, the defective memory chip 24 is first detected and located by an (ECC) scheme, check sum, parity, or any other suitable error detection means. This error detection may occur as a result of periodic memory testing. A memory chip, for example, just before failure may exhibit a gradual increase in failure rate, which can be monitored. A defective memory chip 24 along with its location can thus be identified.

With the location of the defective memory chip 24 identified by the error detection system, a sparer chip 26 can access the defective memory chip 24 through an address register 28 included within the cross-point memory (CPM) cell 23 of sparer chip 26. The cross-point memory (CPM) cell 23 is constructed to be actuated upon a read to the defective memory chip 24 and to replace the defective memory chip 24 with a spare or replacement chip 26. Data can then be routed to and from the spare chip 26 through the cross-point memory (CPM) cell 23 of sparer chip 22 and back to the (CPU) 12. A plurality of cross-point memory CPM) cells 23 are located in each sparer chip 22. Each cross-point memory (CPM) cell 23 includes a cross-point memory address register 28 that allows data to be mapped to and from the (CPU) through the spare chip 26. The cross-point memory (CPM) cell 23 is adapted to switch this data to the spar chip 26 upon signals from the (CPU) 12.

A read/write map can thus be established to and from the spare chip 26 to the (CPU).

Figure 3:
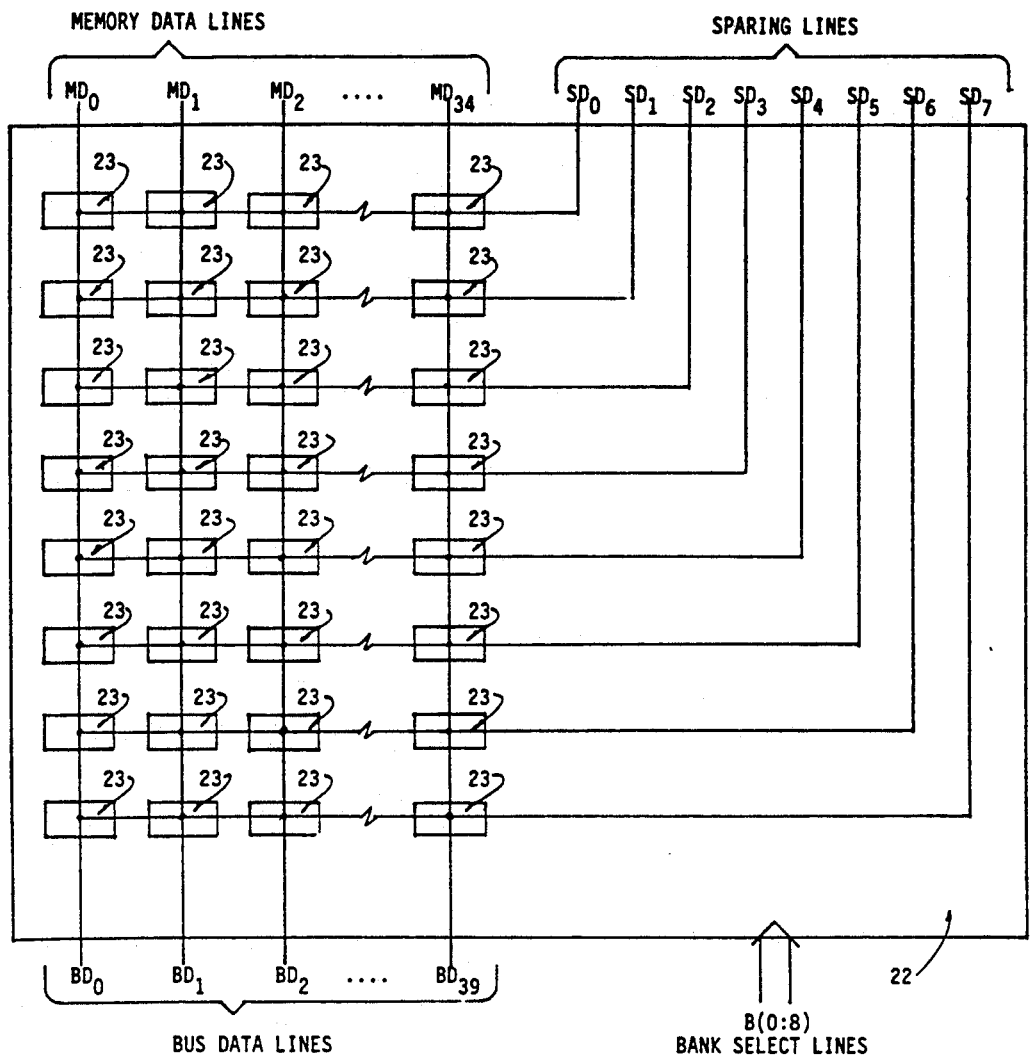
FIG. 3 is an electrical schematic showing an array of cross-point memory (CPM) cells in a sparer chip and their interface with bus data lines, memory data lines, and spare data lines constructed in accordance with the invention.
Figure 4:
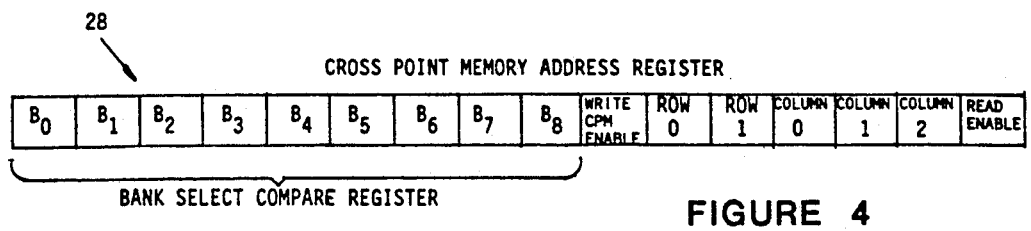
FIG. 4 is a schematic of an address register for a cross-point memory cell of the sparer chip of FIG. 3.

Referring now to FIGS. 3 and 4, a sparer chip 22 constructed in accordance with the invention for a by-8 memory device is shown. As shown, the sparer chip 22 includes eight separate banks B(0:8), any of which can be accessed through a bank select line. Each bank B(0:8), in turn, includes forty bus data lines ($BD_0$–$BD_{39}$) as a route for any values moving from memory to the (CPU) 12. A plurality of cross-point memory (CPM) cells 23 are located between the data bus lines ($BD_0$–$BD_{39}$) and memory data lines ($MD_0$–$MD_{39}$) and are also connected to the spare memory chips 20 through sparer lines ($SD_0$–$SD_7$). The memory data lines ($MD_0$–$MD_{39}$) in turn are connected to the individual semiconductor memory CHIPS 19 of the memory array chips. In this illustrative embodiment, there are eight separate spare memory chips 26 serviced by eight separate sparing lines ($SD_0$–$SD_7$). Alternately, a lesser or greater number of spare memory chips 26 and sparer lines ($SD_0$–$SD_7$) may be provided depending on the application. The spare memory chips 26 are preferably of the same construction as the memory chips 19 in the memory array.

Each sparer chip 22 is thus connected to a sparing line ($SD_0$–$SD_7$) to the memory data lines ($MD_0$–$MD_{39}$) and to the bus data lines ($BD_0$–$BD_{39}$) by the plurality of cross-point memory (CPM) cells 23. As previously stated, each sparing line ($SD_0$–$SD_7$), in turn, is connected to spare chips which are preferably identical in construction to the chips in memory. Each spare memory chip 26 is fully independent to any other memory chip. The cross-point memory (CPM) cells 23 allow the 8-bit ($SD_0$–$SD_{39}$) sparing lines to be connected to any of the 40 bus data ($BD_0$–$BD_{39}$) lines. Additionally, the cross-point memory (CPM) cells 23 function to disconnect a write from a defective chip 24 through the bus data lines ($BD_0$–$BD_{39}$) to the (CPU) 12. Each sparing line ($SD_0$–$SD_7$) connects to all the bus data lines ($BD_0$–$BD_{39}$) via the plurality of cross-point memory (CPM) cells 23. Each cross-point memory (CPM) cell 23 can be actuated by the (CPU) 12 to connect a sparing line ($SD_0$–$SD_7$) to a bus data line ($BD_0$–$BD_{39}$) while at the same time disconnecting a memory data line ($MD_0$–$MD_{39}$) during a read to a defective memory chip 24. On a write, the data are written to both the defective memory chip 24 and the spare memory chip 26.

A cross-point memory (CPM) address register 28 is included in each cross-point memory (CPM) cell 23. As shown in FIG. 4, the (CPM) address register 28 functions as a means for mapping a route to and from the spare chips 26 through the cross-point memory (CPM) cells 23 to the (CPU). As shown in FIG. 4, each actuated cross-point memory (CPM) cell 23 is addressed through a bank number (9 bits), a sparing position coordinate of row (2 bits) and column (3 bits), and read enable and write enable flag bits. In use, a spare memory chip 26 can be assigned to shadow a suspected defective memory chip 24 such that data is written to both the defective chip 24 and spare memory chip 26 (i.e., allows only one or the other to be read). Upon failure of the defective chip 24, the cross-point memory (CPM) cell 23 can be actuated to disconnect a read from the defective chip 24 and connect a read from the spared memory chip 26 to the (CPU).

All cross-point memory (CPM) cells 23 compare their bank number to the incoming bank number. A cross-point memory (CPM) cell 23 that matches incoming bank data will connect its bus data ($BD_0$–$BD_{39}$) to the sparing line ($SD_0SD_7$) and actuate the appropriate row and column lines. In programming a cross-point memory (CPM) cells 23, the same row number must be used for a given bank number to differentiate the row-to-column matrix. If two or more sparer chips 22 are to be assigned per bank number, they must have the same row number for a unique sparer chip 22 to be accessed.

Figure 7:
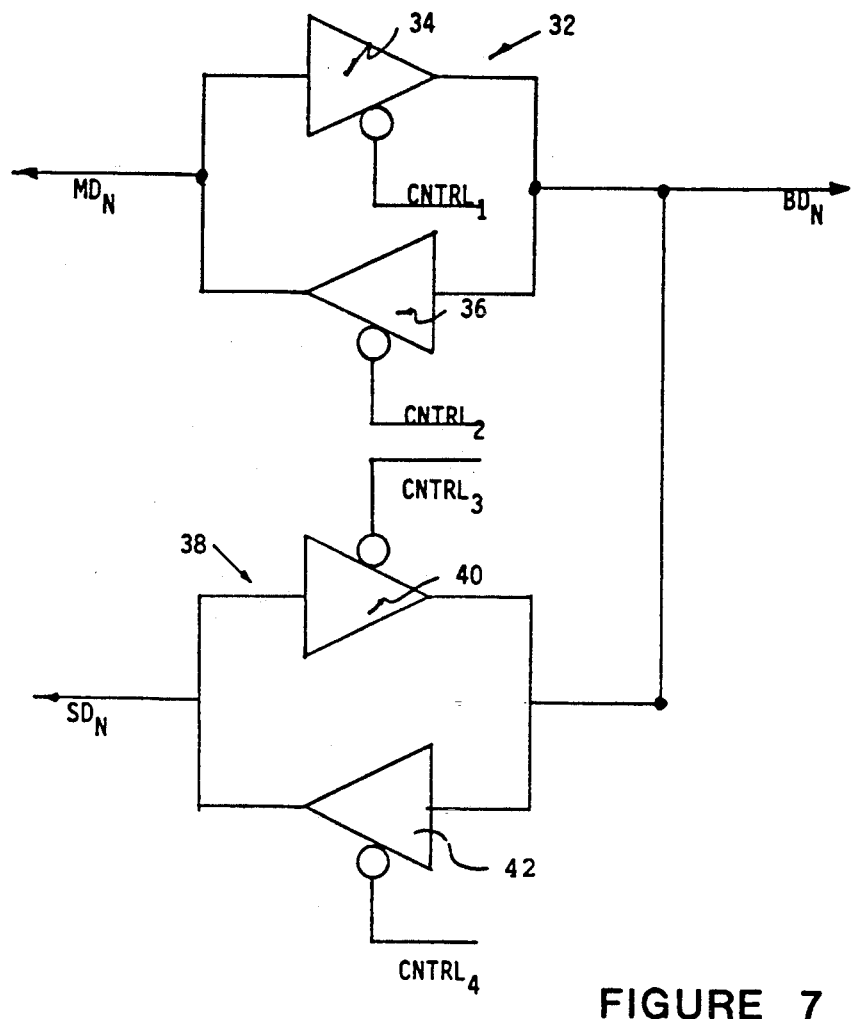
FIG. 7 is an electrical schematic of a single crosspoint memory (CPM) cell of a sparer chip constructed in accordance with the invention.
Figure 8:
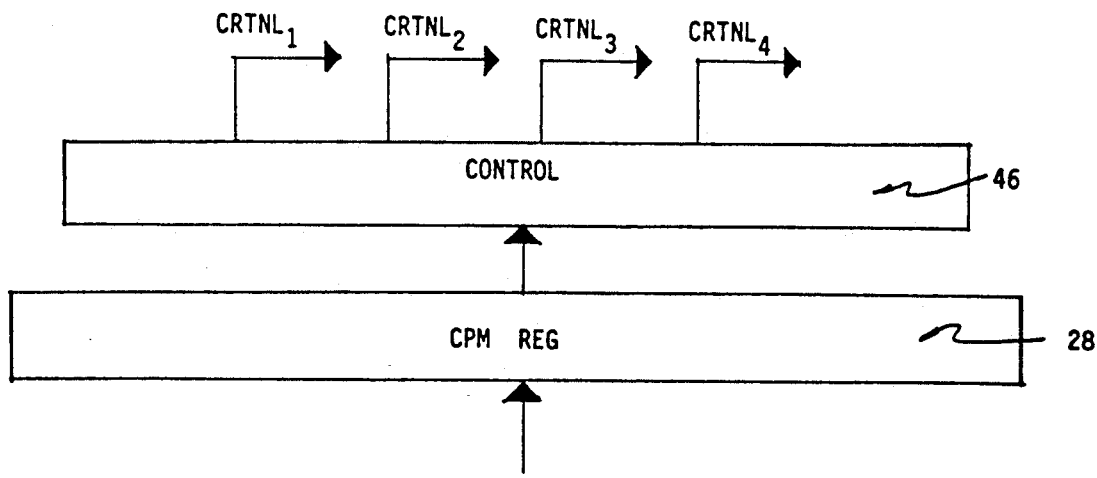
FIG. 8 is a schematic of an address register and control section for the cross-point memory (CPM) cell shown in FIG. 7.

With reference to FIGS. 7 and 8, an electrical schematic of a cross-point memory (CPM) cell 23 is shown. In general, each cross-point memory (CPM) cell 23 provides a logic circuit for mapping data to and from the spare chips 26 through the sparer data line ($SD_n$) and to the (CPU) 12. The logic circuit is controlled by four control inputs $CNTRL_1$–$CNTRL_4$ which are accessed through the cross-point memory register 28 to the appropriate cross-point memory (CPM) cell 23 for a defective chip 24. It is to be understood that this is an illustrative circuit and that other logic arrangements would also be suitable for this application.

As shown in FIG. 7, a first logic circuit 32 is located between the bus data lines ($BD_n$) and memory data lines ($MD_n$) and includes a driver component 34 and a receiver component 36 connected in parallel. Likewise, a second logic circuit 38 is located between the bus data lines ($BD_n$) and spare data lines ($SD_n$) and includes a driver component 40 and receiver component 42. As is apparent, each logic circuit 32, 38 can be controlled by input from $CNTRL_1$–$CNTRL_4$ to control input/output between the bus data lines ($BD_n$) and either the memory data lines ($MD_n$) or the spare data lines ($SD_n$). As shown in FIG. 8, each cross-point memory (CPM) cell 23 may include a control section 46 which accesses a cross-point memory (CPM) cell 23 through the cross-point memory (CPM) register 28.

Figure 5:
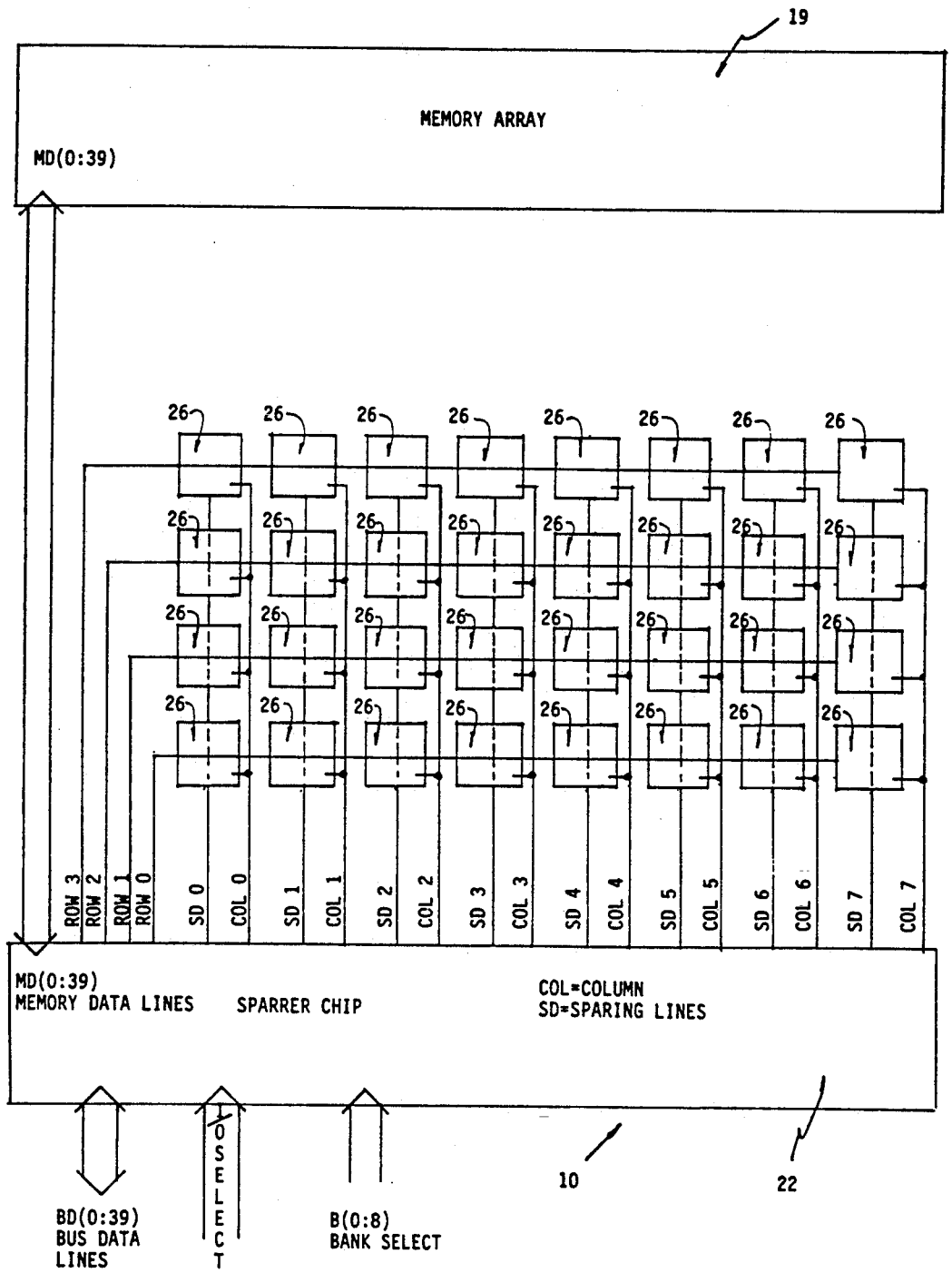
FIG. 5 is an electrical schematic of a spare memory system constructed in accordance with the invention shown with a by-1 memory arrangement.
Figure 6:
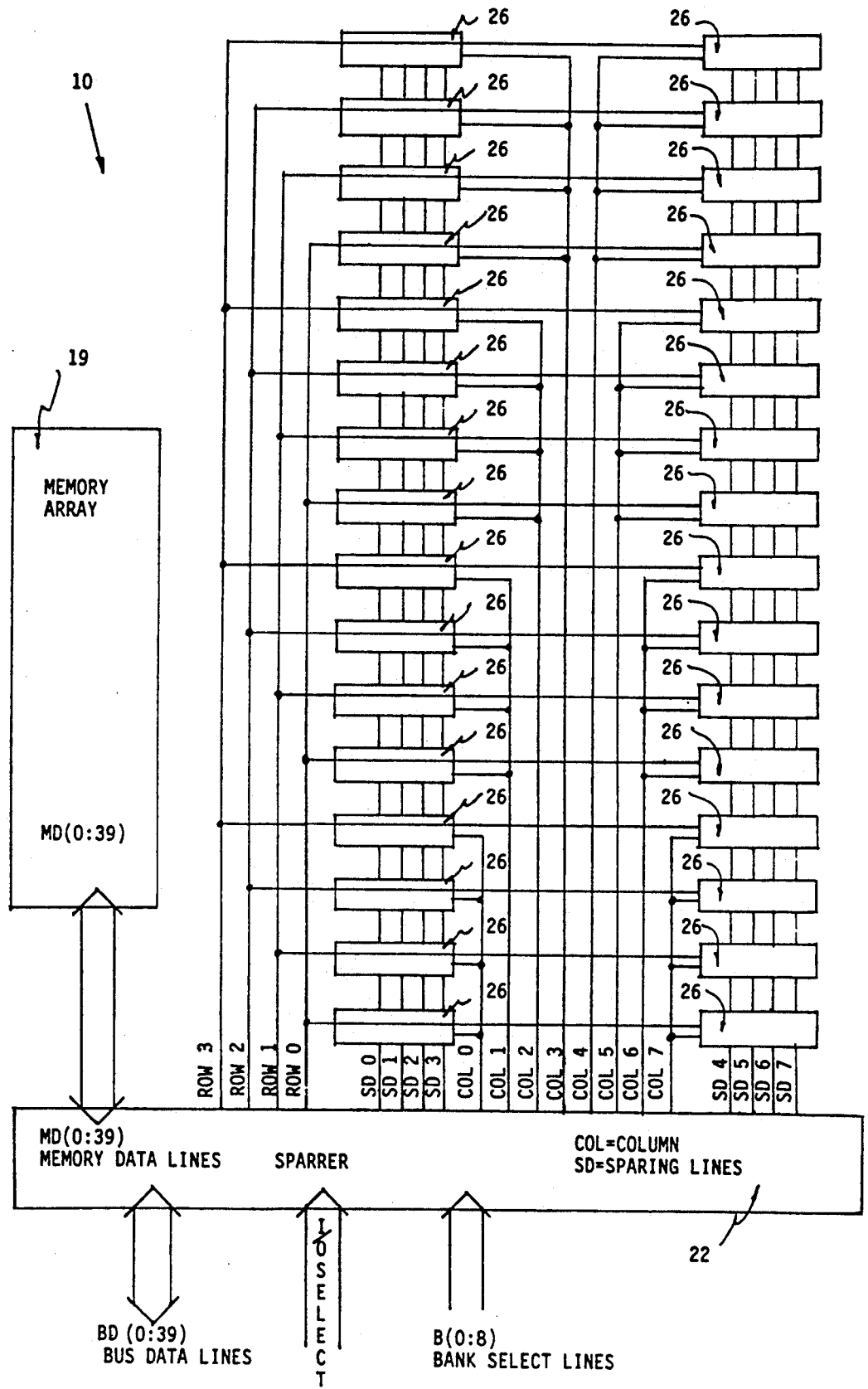
FIG. 6 is an electrical schematic of a spare memory system constructed in accordance with the invention shown with a by-4 memory arrangement.

In FIG. 5, a memory constructed in accordance with the invention for a 32x1 memory (i.e., has only one input/output) is shown. As shown, a plurality of spare memory chips 26 are connected to a sparer chip 22 via the sparer data lines ($SD_0$–$SD_7$) and row ($ROW_0$–$ROW_4$) and column ($COL_0$–$COL_7$) lines. A sparer chip 22 in turn is connected through memory data lines ($MD_0$–$MD_{39}$) to the memory array 19. A sparer chip 22 is also connected to the (CPU) via the bus data lines ($BD_0$–$BD_{39}$). In FIG. 6, a memory constructed in accordance with the invention for a 32x4 memory (i.e. four input/outputs) is shown. These schematics illustrate wiring arrangements for a maximum spare memory of 32 spare memory chips 26. A by-8 memory sparing chip configuration could be constructed the same as the by-4 illustrated in FIG. 6, except all eight sparer data lines ($SD_0$–$SD_8$) would go to each chip for a total of 32 spare memory chips 26. As previously stated, the spare memory chips 26 are preferably identical to the memory chips in the memory array 19. In assigning a spare memory chip 26 for each bank, it must have the same row address number. A 9-bit bank number allows 512 banks to be differentiated, by assigning the B(0:8) bits independent of the actual bank; a smaller memory segment can be spared out. For example, for a 16 meg memory array (16 meg/512=32K), 32K memory segments could be spared and would function in the same manner as the banks.

The spare memory arrangement 10 illustrated could also be constructed with a DRAM controller built into it. The sparer chips 22, for instance, could control both the memory in the array as well as the sparing memory.

Additionally, an (ECC) function and a counter-per-bank could also be built into the sparer chip 22. Each counter could total the (ECC) correction and record the bit number that was corrected. This counter could be read periodically to determine if a defective memory chip 24 needs to be replaced. A memory chip just before failure may exhibit a gradual increase in failure rate which could be monitored for switching to a spare memory chip 26.

Thus, the sparing memory arrangement 10 of the invention provides a novel and unobvious means for replacing a defective memory chip 24 with a spare memory chip 26. If a single bit line fails, for instance, a whole chip can be replaced. This is opposed to prior art redundant row and column arrangements which, in general, function to replace single bit lane losses. Although the invention has been described for use with a 32 data bit, with 8 check bits and 8 sparing bits, it is to be understood that this configuration is not fixed. If, for example, greater reliability is required for a memory array, more sparing components can be assigned by increasing the row or column of sparing bits.

While the apparatus of the invention then has been described with reference to a preferred embodiment, as will be apparent to those skilled in the art, certain changes and modifications can be made without departing from the scope of the invention as defined by the following claims.

What is claimed is:

1. A memory system for a central processing unit (CPU) comprising:
   a memory array including a plurality of semiconductor memory chips connected to memory data lines (MDn) to the CPU;
   a plurality of spare memory chips identical in construction to the memory chips of the memory array said spare memory chips connected to spare data lines ($SD_n$);
   detection means operable through interface logic associated with the CPU for detecting and locating a defective memory chip in the memory array using an error correction code (ECC); and
   a plurality of sparer chips each said sparer chip including a plurality of cross point memory (CPM) cells connected to the spare data lines ($SD_n$) to the memory data lines ($MD_n$) and to bus data lines ($BD_n$) to the CPU, with the cross point memory (CPM) cells operable through a control circuit in communication with the (CPU) and operable upon input from the detection means to connect a selected spare data line ($SD_x$) to a selected bus data line ($BD_x$) for enabling a spare memory chip to replace a detected defective memory chip and with each cross point memory (CPM) cell including a cross point memory register for establishing a route from the (CPU) to a coordinate location of the defective chip and to a selected spare memory chip.

2. The memory system as recited in claim 1 and wherein:
   the cross-point memory (CPM) cell can be controlled by a plurality of data control liens (CNTRL) from the (CPU) to allow data to be read and written through the spare data lines ($SD_n$) to a spare memory chip and through the memory data lines ($MD_n$) to a memory chip.

3. A memory control system for a central processing unit (CPU) comprising:

a memory array having a plurality of memory chips connected to memory data lines ($MD_n$) to the CPU;

a plurality of spare memory chips identical in construction to the memory chips of the memory array, said spare memory chips connected to spare data lines ($SD_n$);

detection means operable through interface logic associated with the CPU for detecting and locating a defective memory chip in the memory array using an error correction code; and a plurality of sparer chips each said sparer chip including a plurality of cross point memory (CPM) cells connected to bus data lines ($BD_n$) to the (CPU) to the spare data lines ($SD_n$) to the plurality of spare memory chips and to the memory data lines ($MD_n$) to the plurality of memory chips with each cross point memory cell including a cross point memory address register operable through a control circuit in communication with the CPU and operable upon input from the detection means for replacing any defective memory chip by connecting a selected spare data line ($SD_x$) to a selected bus data line ($BD_x$) while a memory data line ($MD_x$) to the detected defective memory chip is simultaneously disconnected.

4. A memory control system as recited in claim 3 and wherein:

the spare memory chip is enabled by the cross-point memory (CPM) cell upon a read to the defective chip.

5. A memory control system as recited in claim 4 and wherein:

each cross-point memory (CPM) cell includes a control circuit including:
   a. a first logic circuit connected to a memory data line ($MD_n$) at a first connection and to a bus data ($BD_n$) line at a second connection and including a driver element and a receiver element controlled by four control inputs ($CNTRL_{1-4}$) from the (CPU); and
   b. a second logic circuit connected to a spare memory data line ($SD_n$) at a first connection and to a bus data line ($BD_n$) at a second connection and including a driver element and a receiver element controlled by four control inputs ($CNTRL_{10-4}$) from the (CPU).

6. In a computer system having a central processing unit (CPU) and a memory array with a plurality of memory chips in which a location of a defective chip is determined by an error detection means operable through interface logic associated with the (CPU), a spare memory arrangement comprising:

a plurality of spare memory chips identical in construction to the memory chips of the memory array with each of said spare memory chips connected to a spare data line ($SD_n$); and a plurality of sparer chips each sparer chip including a plurality of cross-point memory (CPM) cells connected to the spare data lines ($SD_n$) to memory data lines ($MD_n$) to the memory array, and to bus data lines ($BD_n$) to the (CPU) and with each cross-point memory (CPM) cell controllable by control input (CNTRL) from the (CPU) said control input (CNTRL) responsive to the error detection means to connect a selected spare data line ($SD_x$) to a selected bus data line ($BD_x$) while simultaneously disconnecting a memory data line ($MD_x$) to a defective chip located by the error detection means and with the cross-point memory (CPM) cells each containing an address register for receiving data from the (CPU) and routing the data to the defective chip having a location determined by the error detection means.

7. The computer memory arrangement as recited in claim 6 and wherein:

the cross-point memory (CPM) cell switches a spare chip to replace a defective chip upon a read to the defective chip.

8. The computer memory arrangement as recited in claim 7 and wherein:

the cross-point memory (CPM) cell comprises a logic circuit including:
   a. a first logic circuit connected to a memory data line ($MD_n$) at a first connection and to a bus data line ($BD_n$) at a second connection and including a driver element and a receiver element controlled by four control inputs ($CNTRL_{1-4}$) from the (CPU); and
   b. a second logic circuit connected to a spare memory data line ($SD_n$) at a first connection and to a bus data line ($BD_n$) at a second connection and including a driver element and a receiver element controlled by four control inputs ($CNTRL_{1-4}$) from the (CPU).

9. The computer memory arrangement recited in claim 8 and wherein:

32 sparer chips are provided.

10. The computer memory arrangement as recited in claim 8 and wherein:

32 sparer chips are provided to spare a maximum of 2 chips per access for a by-4 memory device.

11. The computer memory arrangement as recited in claim 8 and wherein;

32 sparer chips are provided to spare a maximum of 8 chips per access for a by-1 memory device.

12. The computer memory arrangement as recited in claim 8 and wherein:

each cross-point memory (CPM) cell includes a cross-point memory register having bank select bits, a write enable bit, row bits, column bits, and a read enable bit for mapping a route to and from a spare chip to the (CPU).

13. The computer memory array as recited in claim 12 and wherein:

there are nine back select bits ($B_0$-$B_9$), two row bits ($R_0$-$R_1$), and three column bits ($C_0C_2$).

* * * * *